(12) United States Patent
Fujiwara

(10) Patent No.: US 12,362,209 B2
(45) Date of Patent: *Jul. 15, 2025

(54) INFORMATION PROCESSING APPARATUS, INFORMATION PROCESSING METHOD, ARTICLE MANUFACTURING SYSTEM, AND ARTICLE MANUFACTURING METHOD

(71) Applicant: CANON KABUSHIKI KAISHA, Tokyo (JP)

(72) Inventor: Hiroaki Fujiwara, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 359 days.

This patent is subject to a terminal disclaimer.

(21) Appl. No.: 17/590,687

(22) Filed: Feb. 1, 2022

(65) Prior Publication Data
US 2022/0246456 A1 Aug. 4, 2022

(30) Foreign Application Priority Data
Feb. 4, 2021 (JP) .................................. 2021-016443

(51) Int. Cl.
*H01L 21/67* (2006.01)
*G05B 19/4155* (2006.01)
*G06T 11/20* (2006.01)

(52) U.S. Cl.
CPC .... *H01L 21/67276* (2013.01); *G05B 19/4155* (2013.01); *G06T 11/206* (2013.01); *G05B 2219/45031* (2013.01)

(58) Field of Classification Search
CPC .......... H01L 21/67276; G05B 19/4155; G05B 2219/45031; G06T 11/206
(Continued)

(56) References Cited

U.S. PATENT DOCUMENTS 10,546,766 B2 * 1/2020 Matsuo ............. H01L 21/67288
2007/0162172 A1 * 7/2007 Tanaka ............... G05B 23/0221
700/108
(Continued)

FOREIGN PATENT DOCUMENTS

JP 2009170612 A 7/2009
JP 2009271585 A 11/2009
(Continued)

*Primary Examiner* — Abul Azad
(74) *Attorney, Agent, or Firm* — Canon U.S.A., Inc. IP Division

(57) ABSTRACT

An information processing apparatus includes an acquisition unit configured to acquire information including a processing result of processing a substrate by a substrate processing apparatus configured to perform substrate processing at a first timing, event information about an event having occurred in the substrate processing apparatus at a second timing after the first timing, and a processing result of processing the substrate by the substrate processing apparatus at a third timing after the second timing, and a display control unit configured to perform control so that a display device displays a chronological graph of a processing result including the processing result at the first timing and the processing result at the third timing based on the information acquired by the acquisition unit, wherein the display control unit performs control to display information in a superimposed manner on the graph, the information indicating the second timing.

20 Claims, 13 Drawing Sheets

(58) Field of Classification Search
USPC .......................................................... 700/176
See application file for complete search history.

(56) References Cited

U.S. PATENT DOCUMENTS

| | | | | |
|---|---|---|---|---|
| 2013/0060354 | A1* | 3/2013 | Choi ................ | G05B 19/41875 |
| | | | | 700/51 |
| 2013/0066857 | A1* | 3/2013 | Asai ................... | G05B 19/4183 |
| | | | | 707/E17.082 |
| 2014/0032151 | A1* | 1/2014 | Araki ............... | G05B 19/41875 |
| | | | | 702/81 |
| 2019/0236823 | A1* | 8/2019 | Takeno ............... | G05B 19/409 |
| 2022/0198981 | A1* | 6/2022 | Johsaka ................ | G09G 3/006 |

FOREIGN PATENT DOCUMENTS

| | | | |
|---|---|---|---|
| JP | 2009283580 | A | 12/2009 |
| JP | 4653715 | B | 3/2011 |
| JP | 2020184167 | A | 11/2020 |
| TW | 200622509 | A | 7/2006 |
| TW | 201316438 | A | 4/2013 |
| WO | 2014050808 | A1 | 4/2014 |
| WO | 2020212271 | A1 | 10/2020 |

\* cited by examiner

INFORMATION PROCESSING APPARATUS, INFORMATION PROCESSING METHOD, ARTICLE MANUFACTURING SYSTEM, AND ARTICLE MANUFACTURING METHOD

BACKGROUND OF THE DISCLOSURE

Field of the Disclosure

The present disclosure relates to an information processing apparatus, an information processing method, an article manufacturing system, and an article manufacturing method.

Description of the Related Art

In a semiconductor manufacturing factory, a plurality of semiconductor manufacturing apparatuses such as a substrate processing apparatus for processing substrates is normally installed, and accurate determination of an operational status of each of the apparatus and efficient substrate processing based on the determination are expected. Further, abnormalities that occur in the semiconductor manufacturing apparatuses are expected to be solved promptly.

Japanese Patent Application Laid-Open No. 2009-170612 discusses a technique for detecting an abnormality in a semiconductor manufacturing apparatus. Specifically, results of processing by the semiconductor manufacturing apparatus are statistically processed for each lot including a plurality of substrates, and a graph of the statistical processing result is displayed. This facilitates prompt recognition of a lot where an abnormality has occurred, and a user can promptly perform an operation for restoring the semiconductor manufacturing apparatus to a normal state.

While the lot where the abnormality has occurred can be determined based on the statistical processing result, it is difficult to determine a cause of the abnormality. For example, it is difficult to instantly determine whether the abnormality is caused by an operation on the apparatus or whether the abnormality is caused by a change in the apparatus over time. Thus, it takes a long time to resolve the abnormality.

SUMMARY

According to an aspect of the present invention, an information processing apparatus includes an acquisition unit configured to acquire information including a processing result of processing a substrate by a substrate processing apparatus configured to perform substrate processing at a first timing, event information about an event having occurred in the substrate processing apparatus at a second timing after the first timing, and a processing result of processing the substrate by the substrate processing apparatus at a third timing after the second timing, a selection unit configured to select the event having occurred in the substrate processing apparatus, and a display control unit configured to perform control so that a display device displays a chronological graph of a processing result including the processing result at the first timing and the processing result at the third timing based on the information acquired by the acquisition unit, wherein the display control unit performs control to display information in a superimposed manner on the graph, the information indicating a timing of the occurrence of the event selected by the selection unit.

Further features of the present invention will become apparent from the following description of exemplary embodiments with reference to the attached drawings.

DESCRIPTION OF THE EMBODIMENTS

Figure 1:
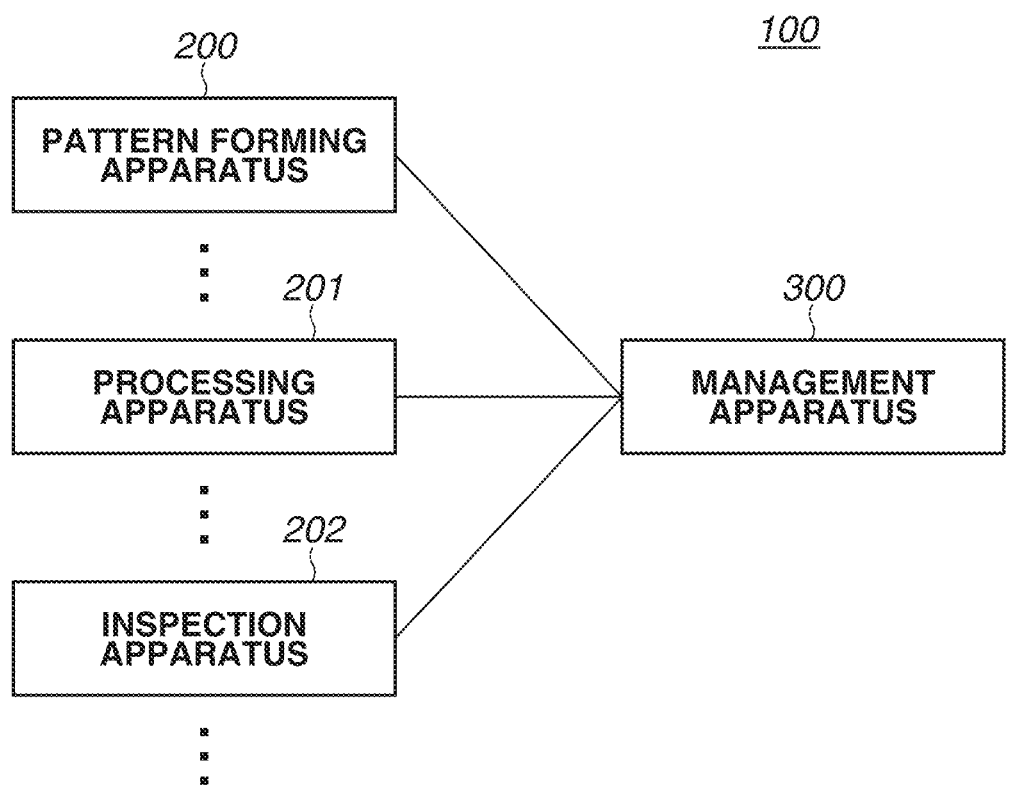
FIG. 1 is a diagram illustrating an article manufacturing system.

Exemplary embodiments of the present invention will be described in detail below with reference to the attached drawings. In the drawings, similar components are designated by the same reference numeral, and redundant descriptions thereof are omitted.

An article manufacturing system including a plurality of apparatuses and a management apparatus that manages operational states of the plurality of apparatuses according to a first exemplary embodiment will be described below. FIG. 1 is a diagram illustrating an article manufacturing system 100. The article manufacturing system 100 according to the present exemplary embodiment includes a pattern forming apparatus 200 (substrate processing apparatus), a processing apparatus 201, an inspection apparatus 202, and a management apparatus 300. The pattern forming apparatus 200 forms a pattern on a wafer (substrate). The management apparatus 300 manages the pattern forming apparatus 200, the processing apparatus 201, and the inspection apparatus 202. Further, the pattern forming apparatus 200, the processing apparatus 201, and the inspection apparatus 202 of the article manufacturing system 100 each include one or more apparatuses.

The pattern forming apparatus 200 includes an exposure apparatus. The exposure apparatus illuminates a reticle (mask, original) having a pattern formed thereon with light to project the pattern to a shot region on a wafer with the light from the reticle. The pattern forming apparatus 200 also includes an imprint apparatus. The imprint apparatus, for example, brings an imprint material supplied on a wafer and a cast (original, mold) into contact with each other and applies energy for hardening to the imprint material so that a composition with a cast shape transferred thereto is formed. Further, the pattern forming apparatus 200 also includes a drawing apparatus. The drawing apparatus performs drawing on a substrate using a charged particle beam such as an electron beam or an ion beam via a charged particle optical system to form a pattern on the substrate. The pattern forming apparatus 200 is configured to perform substrate processing using the foregoing methods.

The processing apparatus 201 includes manufacturing apparatuses that perform a process other than processes performed by the exposure apparatus and other apparatuses in manufacturing an article such as a device. Examples thereof include an application apparatus that applies a photosensitive medium to a substrate surface, and a development apparatus that develops a substrate having a pattern transferred thereto. Besides the foregoing apparatuses, the processing apparatus 201 includes an etching apparatus and a deposition apparatus.

The inspection apparatus 202 includes, for example, an overlay inspection apparatus, a line width inspection apparatus, a pattern inspection apparatus, and an electrical characteristic inspection apparatus. The overlay inspection apparatus refers to an apparatus that inspects accuracy of positioning of patterns on upper and lower layers of a substrate including multi-layers each having a pattern formed thereon. The line width inspection apparatus refers to an apparatus that inspects accuracy of dimensions such as a line width of a pattern formed on a substrate. The pattern inspection apparatus refers to an apparatus that inspects whether there is a pattern that does not satisfy the accuracy due to foreign particles on a substrate on which the pattern is formed or due to absence of an imprint material. The electrical characteristic inspection apparatus refers to an apparatus that inspects accuracy of an electrical characteristic of a semiconductor device manufactured using a substrate having a pattern formed thereon.

Figure 2:
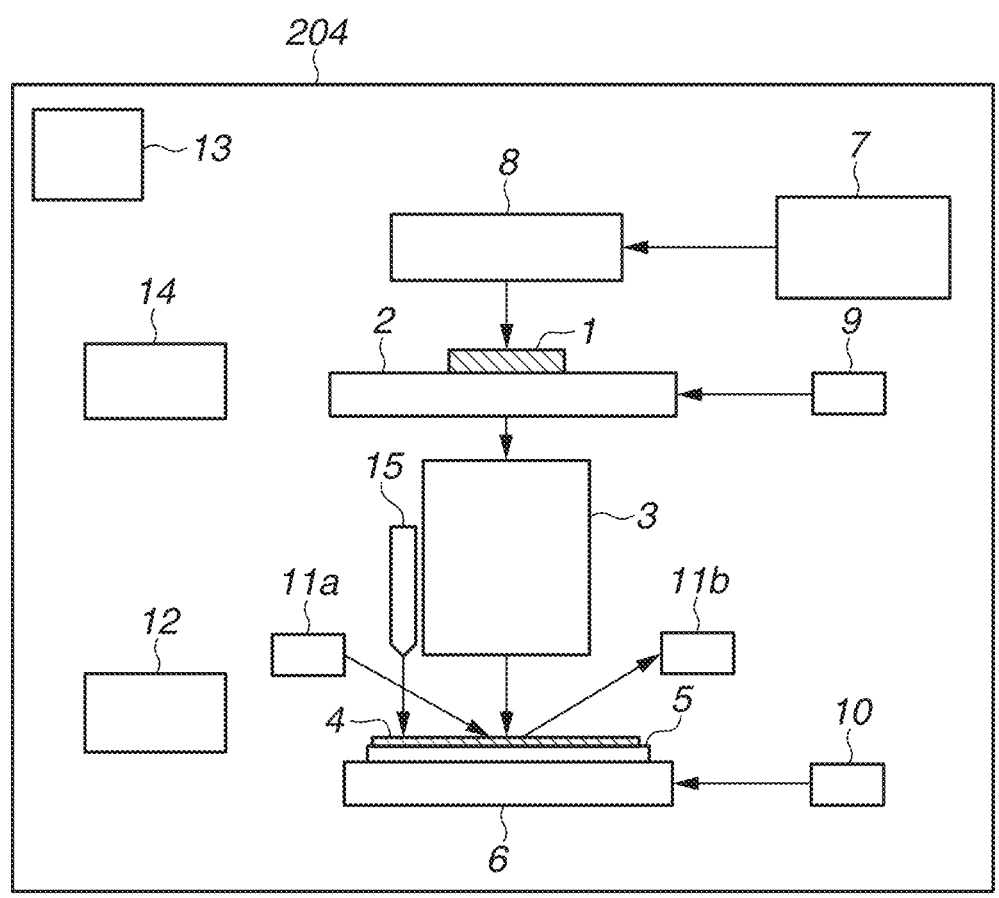
FIG. 2 is a diagram illustrating an exposure apparatus as an example of a pattern forming apparatus.

Next, an exposure apparatus that exposes a wafer to light from a reticle having a pattern formed thereon will be described as an example of the pattern forming apparatus 200. FIG. 2 is a diagram illustrating an exposure apparatus 204 as an example of the pattern forming apparatus 200. The exposure apparatus 204 according to the present exemplary embodiment will be described as a step-and-scan exposure apparatus that performs exposure while driving a reticle stage and a wafer stage in synchronization with each other. The exposure apparatus 204 is not limited to a scanner and can be a step-and-repeat exposure apparatus that performs exposure in a state where a wafer stage is immobilized. In the example illustrated in FIG. 2, the exposure apparatus 204 includes a light source 7, an illumination optical system 8, a reticle stage 2, a projection optical system 3, a wafer stage 6, a wafer chuck 5, and a control unit 13. The exposure apparatus 204 also includes laser interferometers 9 and 10, a focus sensor 11, a wafer conveyor unit 12, a reticle conveyor unit 14, and an alignment scope 15. In FIG. 2, a direction that is parallel to an optical axis of the projection optical system 3 will be referred to as a Z-axis direction, and two directions that are orthogonal to each other in a plane vertical to the Z-axis direction will be referred to as an X-axis direction and a "Y-axis direction.

Examples of the light source 7 include a high-pressure mercury lamp, an argon fluoride (ArF) excimer laser, and a krypton fluoride (KrF) excimer laser. The light source 7 does not have to be inside a chamber of the exposure apparatus 204 and can be an external light source. Light emitted from the light source 7 travels through the illumination optical system 8 and illuminates a reticle 1. The reticle 1 is placed on the reticle stage 2 and has a pattern drawn thereon. The pattern is to be transferred to a wafer 4 to which a photosensitive material is applied. The reticle stage 2 holds the reticle 1 by adsorption via a reticle chuck and is movable by, for example, a linear motor.

The projection optical system 3 projects an image of the pattern drawn on the reticle 1 to the wafer 4 placed on the wafer chuck 5. During the projection of the image of the pattern to the wafer 4, an image reversed and reduced at a projection magnification (e.g., one fourth) is projected to the wafer 4 via the projection optical system 3.

Each region where an image of a pattern is projected will be referred to as a shot region. A plurality of shot regions is set on the wafer 4, and the projection is repeatedly performed on the short regions one after another.

The wafer stage 6 is driven by an actuator such as a linear motor and is movable in X- and Y-directions. The wafer chuck 5 is placed on the wafer stage 6 and holds the wafer 4. The wafer 4 held by the wafer chuck 5 is moved as the wafer stage 6 and the wafer chuck 5 are driven.

The laser interferometer 9 measures the position of the reticle stage 2 in the Y-direction and measures the orientation of the reticle stage 2. The laser interferometer 9 includes a laser interferometer for measuring the position of the reticle stage 2 in the X-direction similarly. The laser interferometer 10 measures the position of the wafer stage 6 holding the wafer 4 in the Y-direction and measures the orientation of the wafer stage 6. The laser interferometer 10 includes a laser interferometer for measuring the position of the wafer stage 6 in the X-direction similarly. The positions of the reticle stage 2 and the wafer stage 6 are controlled by the control unit 13 described below based on the positions measured by the laser interferometers 9 and 10.

The focus sensor 11 includes a light projecting system 11a, a light receiving system 11b, and a detection unit. The light projecting system 11a projects light to the wafer 4. The light receiving system 11b receives reflection light from the wafer 4. The detection unit detects light from the light receiving system 11b and outputs a detection signal to the control unit 13. The light projecting system 11a and the light receiving system 11b are arranged to sandwich an area around an emission portion of the projection optical system 3. The light projecting system 11a illuminates the wafer 4 with obliquely incident light, and the light receiving system 11b captures reflected light on the opposite side. The control unit 13 described below measures the position of the wafer 4 in a Z-direction based on the detection signal detected by the focus sensor 11 and controls the movement of the wafer 4 by the wafer stage 6.

The wafer conveyor unit 12 conveys the wafer 4. The wafer conveyor unit 12 conveys the wafer 4 from a wafer storage container storing the wafer 4 to the wafer stage 6. The wafer conveyor unit 12 also conveys the wafer 4 from the wafer stage 6 to the wafer storage container.

The reticle conveyor unit 14 conveys the reticle 1. The reticle conveyor unit 14 conveys the reticle 1 from a reticle storage container storing the reticle 1 to the reticle stage 2. The reticle conveyor unit 14 also conveys the reticle 1 from the reticle stage 2 to the reticle storage container.

The alignment scope 15 acquires a digital image signal of a captured image of a mark formed on the wafer 4 to align the wafer 4 held by the wafer chuck 5. The alignment scope 15 includes an image sensor and an analog-to-digital (A/D)

converter. The image sensor outputs a grayscale image signal based on the brightness, i.e., intensities, of reflection light from the wafer 4, and the A/D converter converts the grayscale image signal acquired from the image sensor into a digital image signal. The control unit 13 described below detects the position of the mark formed on the wafer 4 using the acquired digital image signal and controls the wafer stage 6 based on the detected position of the mark to align the wafer 4.

The control unit 13 controls exposure processing on the wafer 4 by controlling operations and adjustments of the components of the exposure apparatus 204. The control unit 13 includes, for example, a programmable logic device (PLD) such as a field-programmable gate array (FPGA), an application-specific integrated circuit (ASIC), a program-installed computer, or a combination of all or some of the above. The control unit 13 can be configured to be integral with another portion of the exposure apparatus 204 (in the same housing) or separate from the other portion of the exposure apparatus 204 (in a separate housing). The control unit 13 controls the exposure processing (pattern forming processing) on the wafer 4 so that information acquired from a storage device described below is applied.

Figure 3:
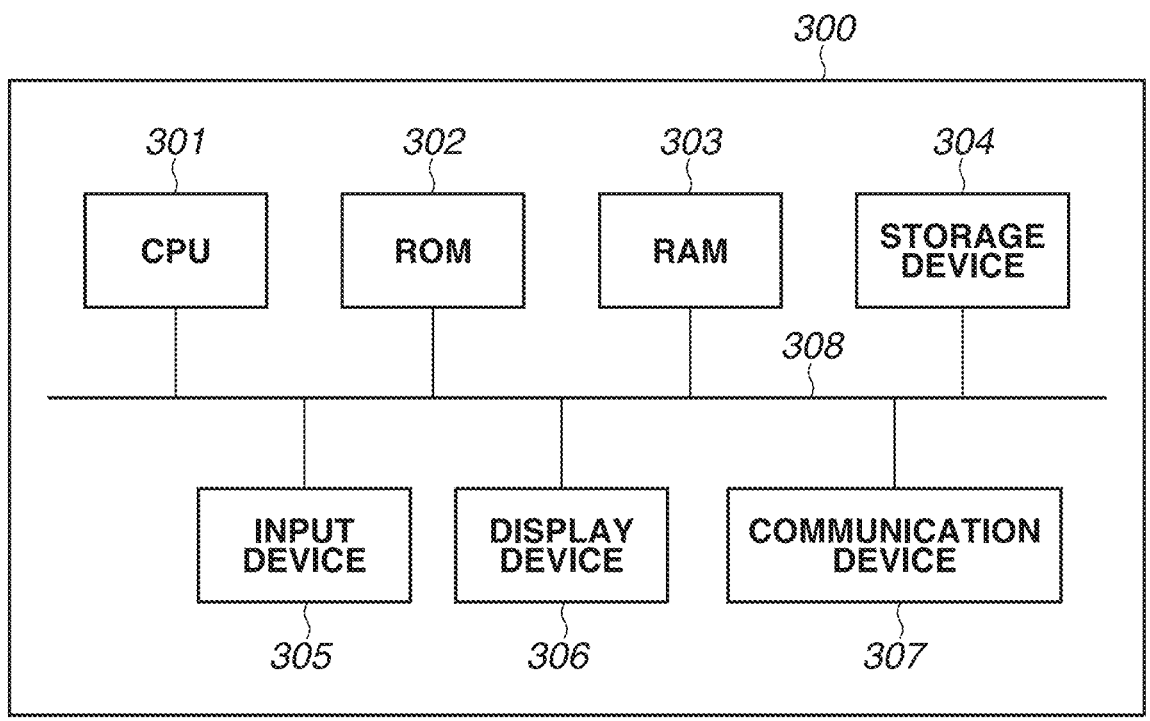
FIG. 3 is a diagram illustrating a hardware configuration of an information processing apparatus.

Next, the management apparatus 300 will be described below. FIG. 3 is a diagram illustrating a hardware configuration of the management apparatus 300. The management apparatus 300 is an information processing apparatus including a central processing unit (CPU) 301, a read-only memory (ROM) 302, a random access memory (RAM) 303, a storage device 304, an input device 305, a display device 306, and a communication device 307. Each hardware component of the information processing apparatus functions based on a program. In the example illustrated in FIG. 3, the CPU 301 is a processing unit that performs computation for control based on a program and controls each component connected to a bus 308. The ROM 302 is a memory for reading data only and stores a program and data. The RAM 303 is a memory for reading and writing data and is used to store a program and data. The RAM 303 is used to temporarily store data such as a result of the computation by the CPU 301. The storage device 304 is also used to store a program and data. The storage device 304 is also used as a temporary storage area for a program of an operating system (OS) of the information processing apparatus and data.

The storage device 304 is slower in data input and output than the RAM 303 but can store a large amount of data. The storage device 304 is desirably a non-volatile storage device to store data as persistent data so that the stored data can be referred to for a long time.

The storage device 304 mainly includes a magnetic storage device (hard disk drive (HDD)) or can be a device to which an external medium such as a compact disk (CD), a digital versatile disk (DVD), or a memory card is attached to read or write data.

The input device 305 is a device for inputting characters and data to the information processing apparatus. Various keyboards and mouses correspond to the input device 305. The display device 306 is a device that plays a role as a user interface of the management apparatus 300 and displays information for operating the information processing apparatus and a processing result. A cathode ray tube (CRT) or a liquid crystal monitor corresponds to the display device 306. The display device 306 also plays a role as the input device 305 in a case where the display device 306 is operable by touching a screen, such as a touch panel. While the input device 305 and the display device 306 are described as part of the management apparatus 300, the input device 305 and the display device 306 are not limited to that described above and can be, for example, part of the pattern forming apparatus 200.

The communication device 307 is used to connect to a network to perform data communication based on the Transmission Control Protocol over Internet Protocol (TCP/IP) and communicate with another apparatus. The information processing apparatus can include a graphics processor unit (GPU) to perform high-speed computation processing. The information processing apparatus connects to a plurality of exposure apparatuses 204 via the communication device 307 to communicate data with the plurality of exposure apparatuses 204.

Figure 4:
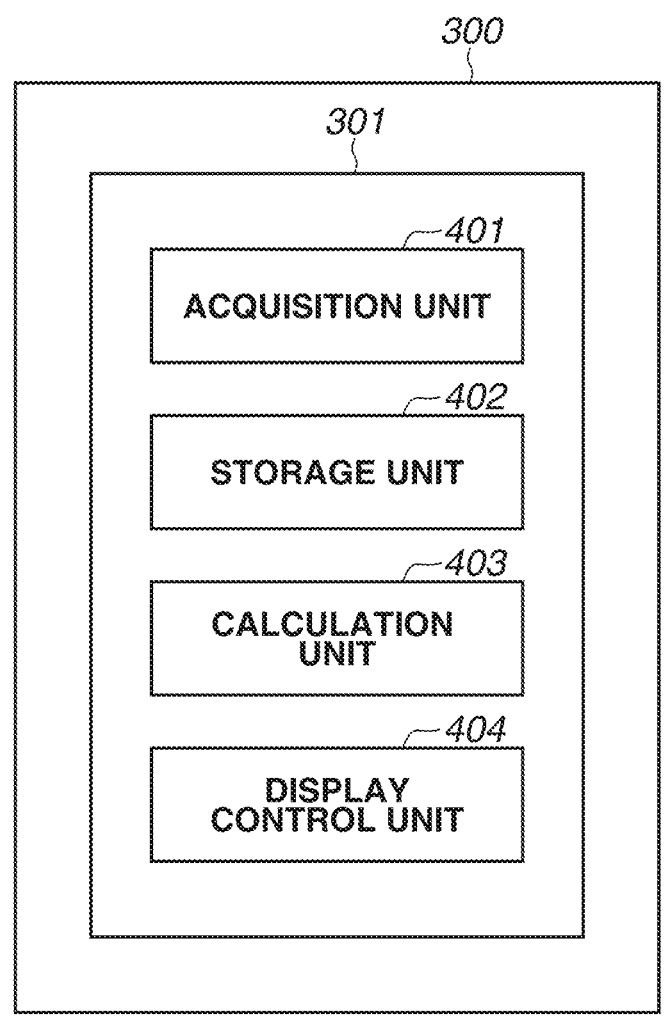
FIG. 4 is a diagram illustrating a configuration of a central processing unit (CPU) of a management apparatus.
Figure 5:
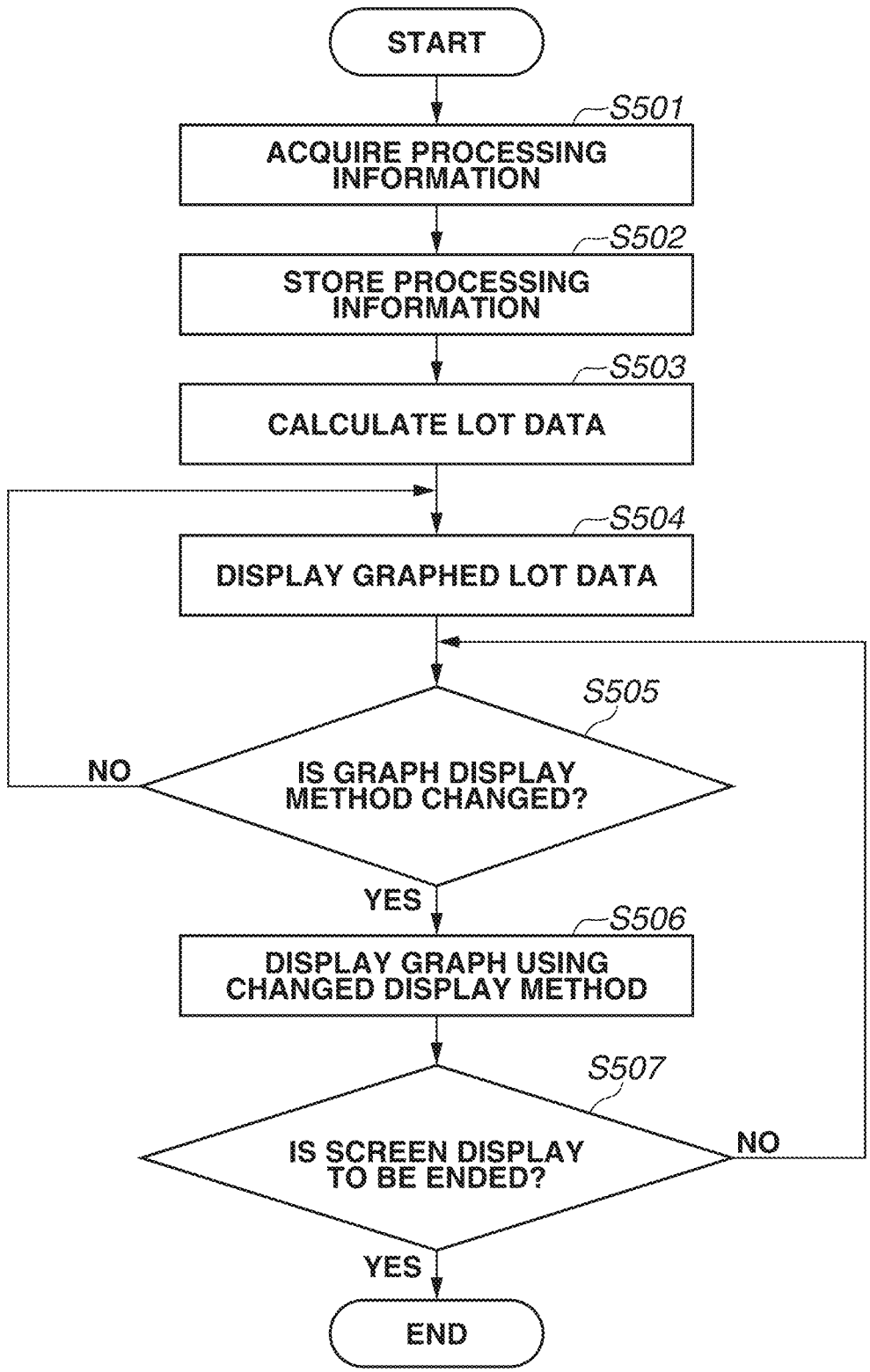
FIG. 5 is a flowchart illustrating a process of displaying on a display device.

FIG. 4 is a diagram illustrating a configuration of the CPU 301 of the management apparatus 300. The CPU 301 includes an acquisition unit 401, a storage unit 402, a calculation unit 403, and a display control unit 404. FIG. 5 is a flowchart illustrating a process of displaying a user interface for analyzing an abnormality that occurs in the exposure apparatus 204.

A display process on the display device 306 of the management apparatus 300 according to the present exemplary embodiment will be described below with reference to FIGS. 4 and 5. In the present exemplary embodiment, display on the display device 306 makes it possible to reduce a time needed to analyze a cause of an abnormality in the exposure apparatus 204. The abnormality according to the present exemplary embodiment includes an abnormality that is so serious that the exposure apparatus 204 is stopped and an abnormality that affects productivity by reducing accuracy of the exposure apparatus 204.

The flowchart in FIG. 5 will be described below. In step S501, the acquisition unit 401 acquires processing information about the exposure apparatus 204. The processing information includes processing data on the substrate processing at a first timing by the exposure apparatus 204, event information about an event that occurs in the exposure apparatus 204 at a second timing after the first timing, and processing data on the substrate processing at a third timing after the second timing by the exposure apparatus 204.

The term processing data refers to information including a result of an operation of the exposure apparatus 204 and a state of a wafer exposed by the exposure apparatus 204, and specific content is synchronization accuracy data and alignment accuracy data. The synchronization accuracy data is data indicating an error in relative positions of the reticle stage 2 and the wafer stage 6 during a period in which the reticle stage 2 and the wafer stage 6 are driven in synchronization with each other in, for example, the Y-axis direction to expose a target shot region. The alignment accuracy data is data indicating an evaluation (symmetry of waveform data, contrast of digital image signal) of a digital image signal acquired by capturing an image of a mark formed on the target wafer 4 and waveform data on the digital image signal.

A processing condition applied in the exposure processing refers to a recipe and an apparatus parameter. The recipe is a processing condition for the wafer 4 to be manufactured. The apparatus parameter is determined for each exposure apparatus 204. The recipe refers to a processing condition that is shared and used by the plurality of exposure apparatuses 204, whereas the apparatus parameter refers to an apparatus-specific processing condition that is not shared by the plurality of exposure apparatuses 204. Examples of the recipe include an amount of exposure in exposing the wafer 4, an individual correction value to follow an exposed pattern, and a selected correction algorithm. Examples of the apparatus parameter include a correction value of the projection optical system 3, a method for controlling the wafer stage 6, and a control parameter. Further, the processing condition is not limited to those described above, and a parameter that defines another processing condition can be displayed.

Examples of the event information about an event that occurs in the exposure apparatus 204 include resetting, parameter change, command execution, and reticle replacement. The resetting refers to initialization of the units of the exposure apparatus 204 and is executed to restore the exposure apparatus 204 to an initial state. A timing when an instruction to initialize all of the units is issued is referred to as a reset start time and a timing when the initialization of all of the units ends is referred to as a reset end time. The parameter change refers to a change of a setting value of various parameters for controlling operations of the exposure apparatus 204. The command execution refers to manual or automatic execution of a command to perform a predetermined operation that is prepared in advance in the exposure apparatus 204. The reticle replacement refers to an operation of replacing the reticle 1 on which a circuit pattern to be transferred to a substrate is drawn.

The event information also includes time information indicating start and end timings of operations of various hardware and software components of the exposure apparatus 204, and information that enables identification of the hardware or software component (unit ID, process ID, etc.). Further, the event information also includes information that enables identification of a wafer on which the exposure processing is performed at that timing, and information that enables identification of the processing condition applied during the exposure processing. Further, the event information can include time information about the time when maintenance of the hardware or software component of the exposure apparatus 204 is performed, and information about the maintenance.

Next, in step S502, the processing information about the exposure apparatus 204 that is acquired in step S501 is stored in the storage unit 402. For example, processing data for each wafer (for each substrate) is stored as the processing information in the storage unit 402.

In step S503, the calculation unit 403 calculates processing data for each lot (lot data) based on the processing data for each wafer stored in the storage unit 402. The lot data is calculated based on a statistical value (e.g., maximum value, minimum value, mean value, median value, standard deviation value) of the processing data for each wafer. Further, the lot data can be calculated not by the calculation unit 403 but by the exposure apparatus 204. For example, the lot data calculated by the exposure apparatus 204 can be acquired from the exposure apparatus 204 by the acquisition unit 401, and then the processing can proceed to step S504.

Figure 6:
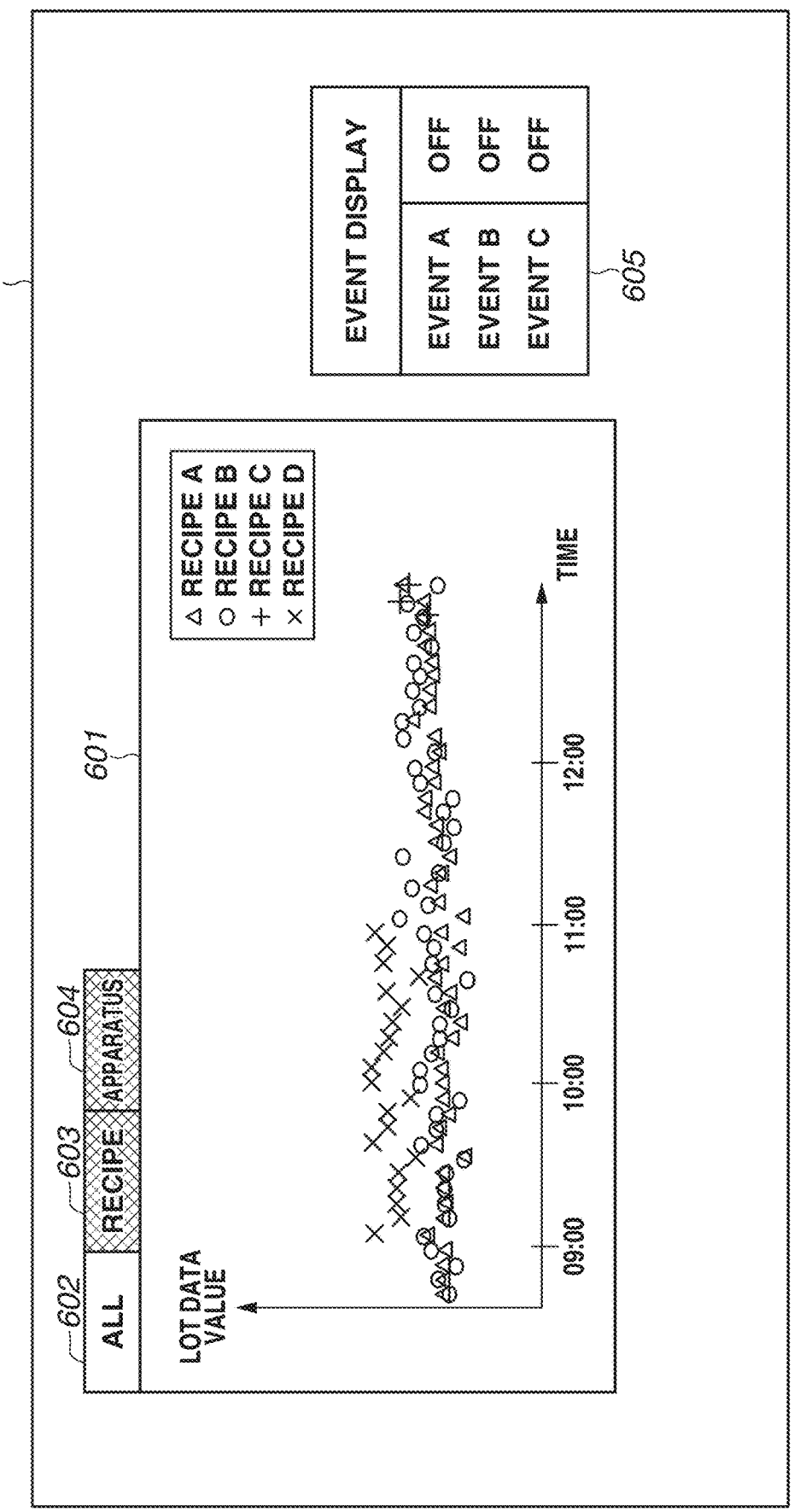
FIG. 6 is a diagram illustrating a graph displaying lot data of different recipes in the same region.

In step S504, the display control unit 404 controls the processing data, including the processing data on the first timing and the processing data on the third timing, to be graphed chronologically and displays a chronological graph as illustrated in FIG. 6. A graph 601 in FIG. 6 is a graph displaying lot data to which different recipes are applied in the same region. The graph 601 is chronologically arranged and displayed, and the horizontal axis of the graph 601 represents the exposure processing execution time whereas the vertical axis represents the lot data value, which is a value of the processing data for each lot.

In FIG. 6, a method of displaying the graph 601 can be changed by using a selection button 602, 603, or 604. FIG. 6 illustrates a state where the selection button 602 is selected.

A user can change the method of displaying the graph 601 by selecting an unselected selection button. The selection buttons 602, 603, and 604 can be combined into a single button.

An event display window 605 (selection unit) displays events that occur in the exposure apparatus 204, and an event to be displayed in a superimposed manner on the graph 601 can be selected from the displayed events. The event display window 605 displays combinations of an event name of an event (three types that are event A, event B, and event C in the example in FIG. 6) and a display state of the event (ON: displayed, OFF: not displayed in the example in FIG. 6). For example, the display state of an event on the event display window 605 can be switched from one state to another each time the event name or the display state of the event is clicked. A plurality of types of events can be displayed.

Figure 7:
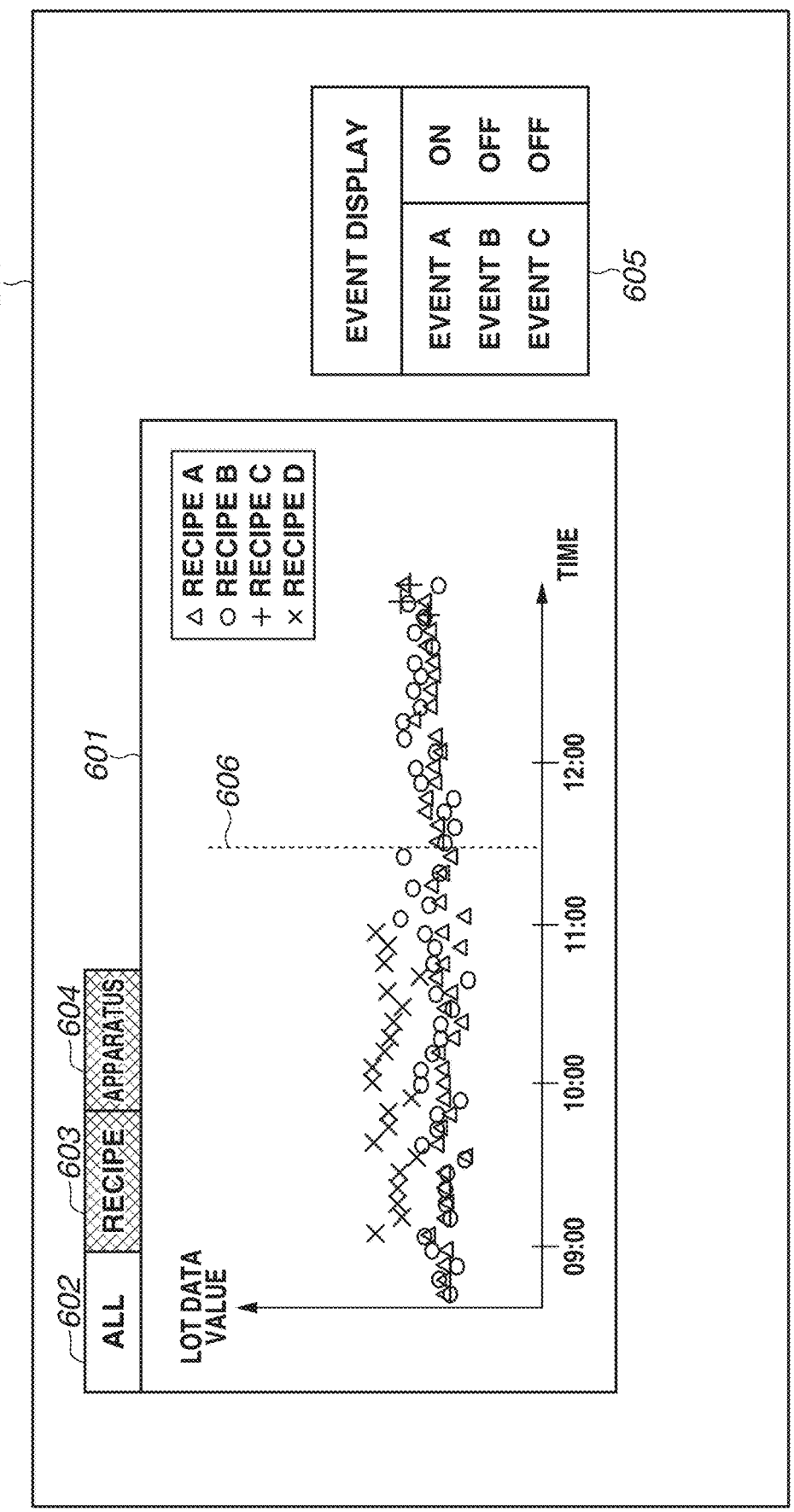
FIG. 7 is a diagram illustrating an event line superimposed on the graph displaying lot data of different recipes in the same region.

FIG. 7 illustrates an example where the display state of the event A is switched from OFF to ON by selecting the event A on the event display window 605 in the display state in FIG. 6. The display control unit 404 can display information indicating the time (second timing) of an occurrence of an event relating to a setting change in the exposure apparatus 204 in a superimposed manner on a graph displaying the processing result. In FIG. 7, the display control unit 404 displays a line 606 indicating an occurrence of the event at a time position corresponding to the timing of the occurrence of the event A on the graph 601. The color and shape of the line 606 can be freely set for each event type. For example, at least one of the color and shape can be changed in displaying an event of a different type. With the color and shape of the line 606 set for each event type, user analysis of a cause of an abnormality in the exposure apparatus 204 is facilitated in a case where event information about a plurality of events is displayed in a super imposed manner on the graph 601.

In a case where the event A occurs a plurality of times in the display range of the horizontal axis of the graph 601, a plurality of lines 606 can be displayed at all time positions of the events A. In order to indicate that the line 606 is a line that relates to the event A, a character string serving as a caption can be added to the line 606, or the color or shape of the line 606 can be changed. Further, instead of the line 606, an arrow or a mark indicating the time position of the event A can be superimposed on the graph 601.

In step S505, the display control unit 404 determines whether the graph display method is changed. Specifically, the display control unit 404 determines whether an unselected button among the selection buttons 602, 603, and 604 is selected by the user. In a case where an unselected button is selected (YES in step S505), the processing proceeds to step S506. Selecting one of the selection buttons 602, 603, and 604 is performed by using an input device such as a mouse, a keyboard, or a touch panel for computers and a program for controlling the same.

Figure 8:
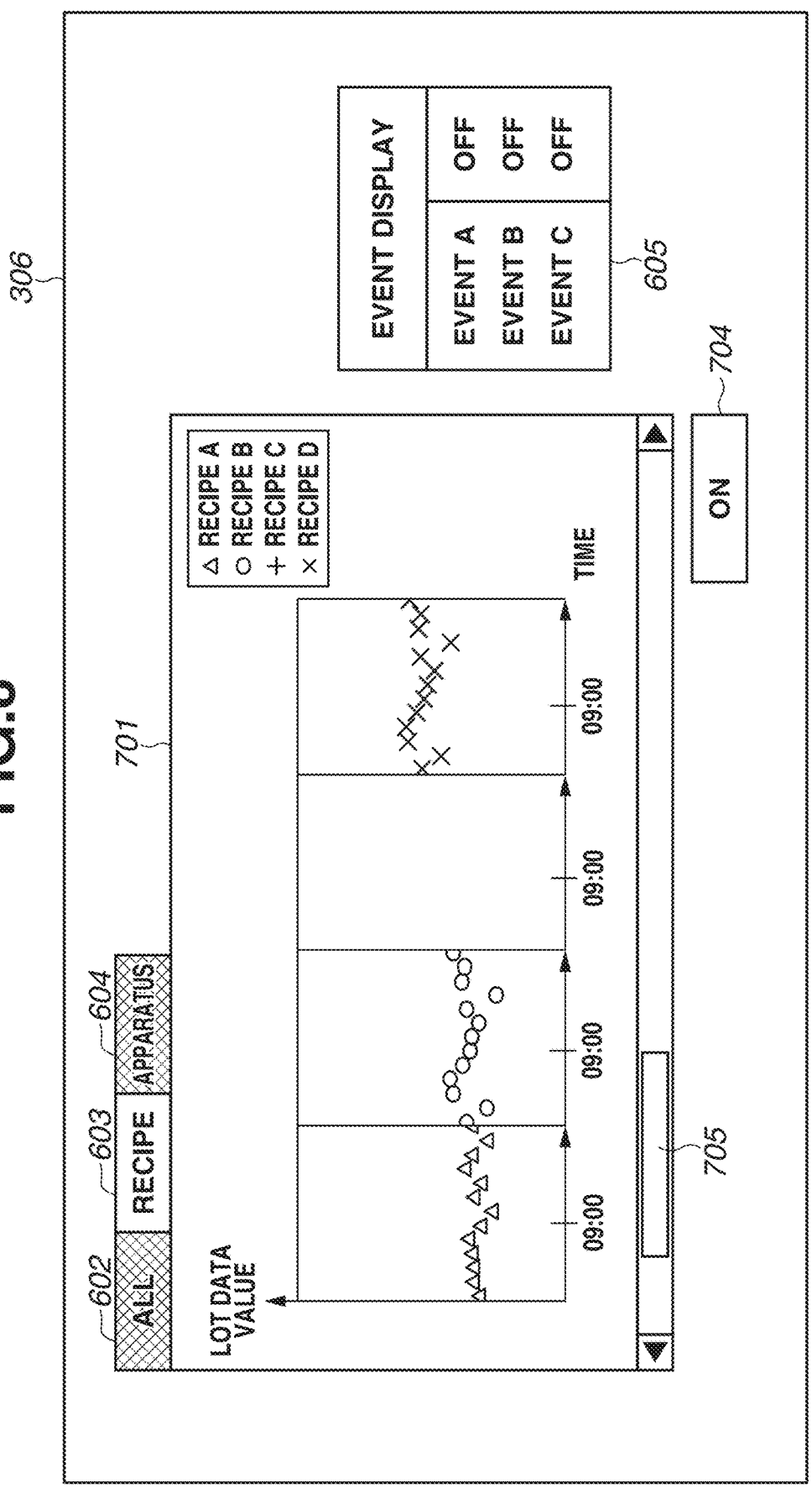
FIG. 8 is a diagram illustrating a graph displaying lot data of different recipes in different regions.

In step S506, the display control unit 404 outputs the lot data calculated in step S503 to the display device 306 and controls the display device 306 to display the lot data as illustrated in FIG. 8. In a graph 701, a display region is divided for each recipe, and the graph 701 displays the lot data of different recipes in different regions. The graph 701 is chronologically displayed, and the horizontal axis of the graph 701 represents the exposure processing execution time and is divided for each recipe. The vertical axis represents the lot data value, which is the value of the processing data for each lot. A scroll bar 705 is used to change the display range of the graph 701. With the scroll bar 705, the lot data in a range that is not displayed in the state illustrated in FIG. 8 can be displayed on the display device 306. Further, the user can select the selection button 602 in the state illustrated in FIG. 8 where the lot data of different recipes are displayed in respective regions so that the state is restored to the state illustrated in FIG. 6 where the lot data to which different recipes are applied are displayed in a superimposed manner on the single graph 601.

Figure 9:
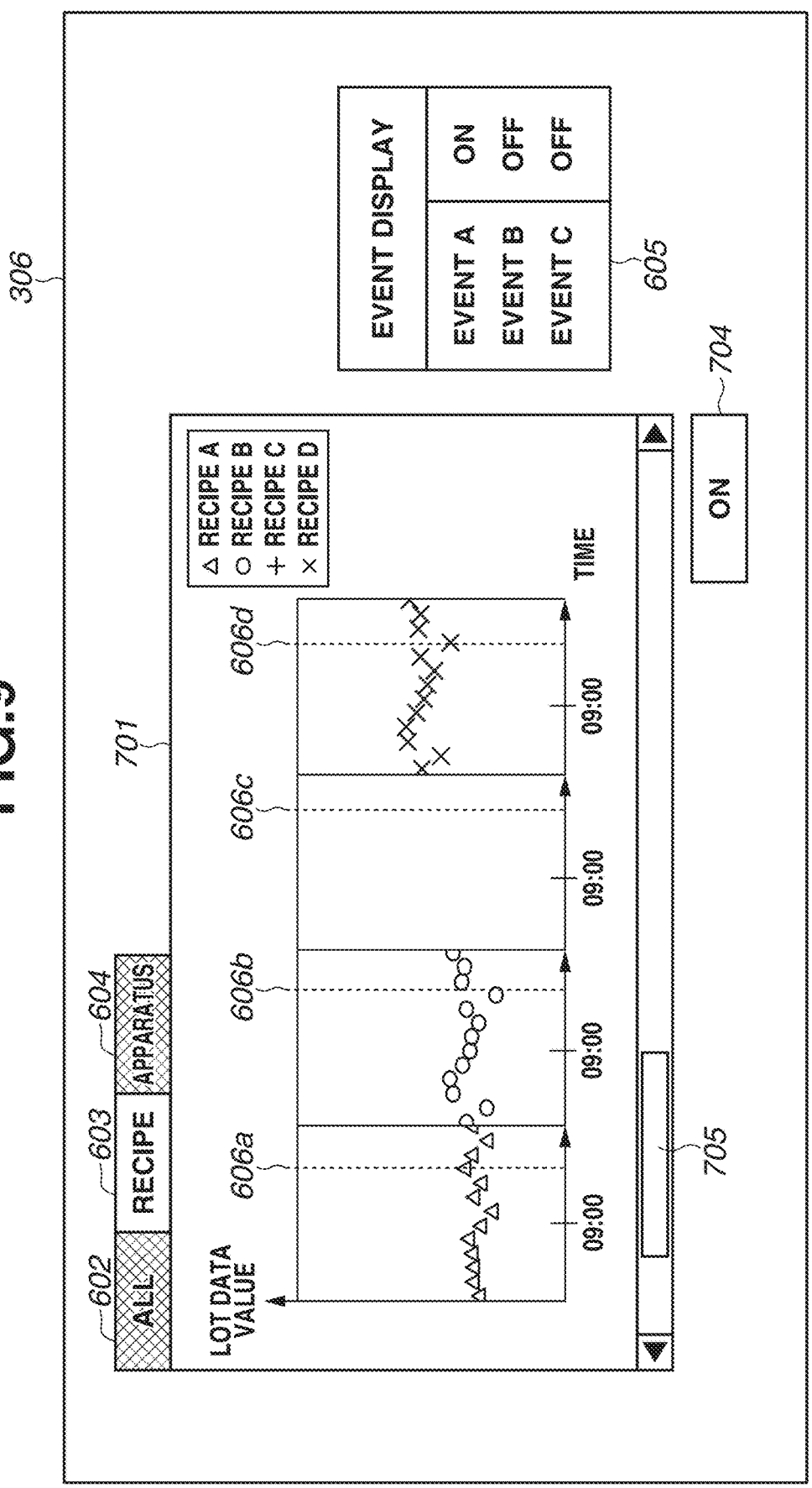
FIG. 9 is a diagram illustrating an event line superimposed on the graph displaying lot data of different recipes in different regions.

FIG. 9 illustrates an example where the display state of the event A is switched from OFF to ON by selection of the event A on the event display window 605 in the display state illustrated in FIG. 8. In FIG. 9, lines 606a to 606d of the event A are displayed in the display regions for the respective recipes.

Figure 10:
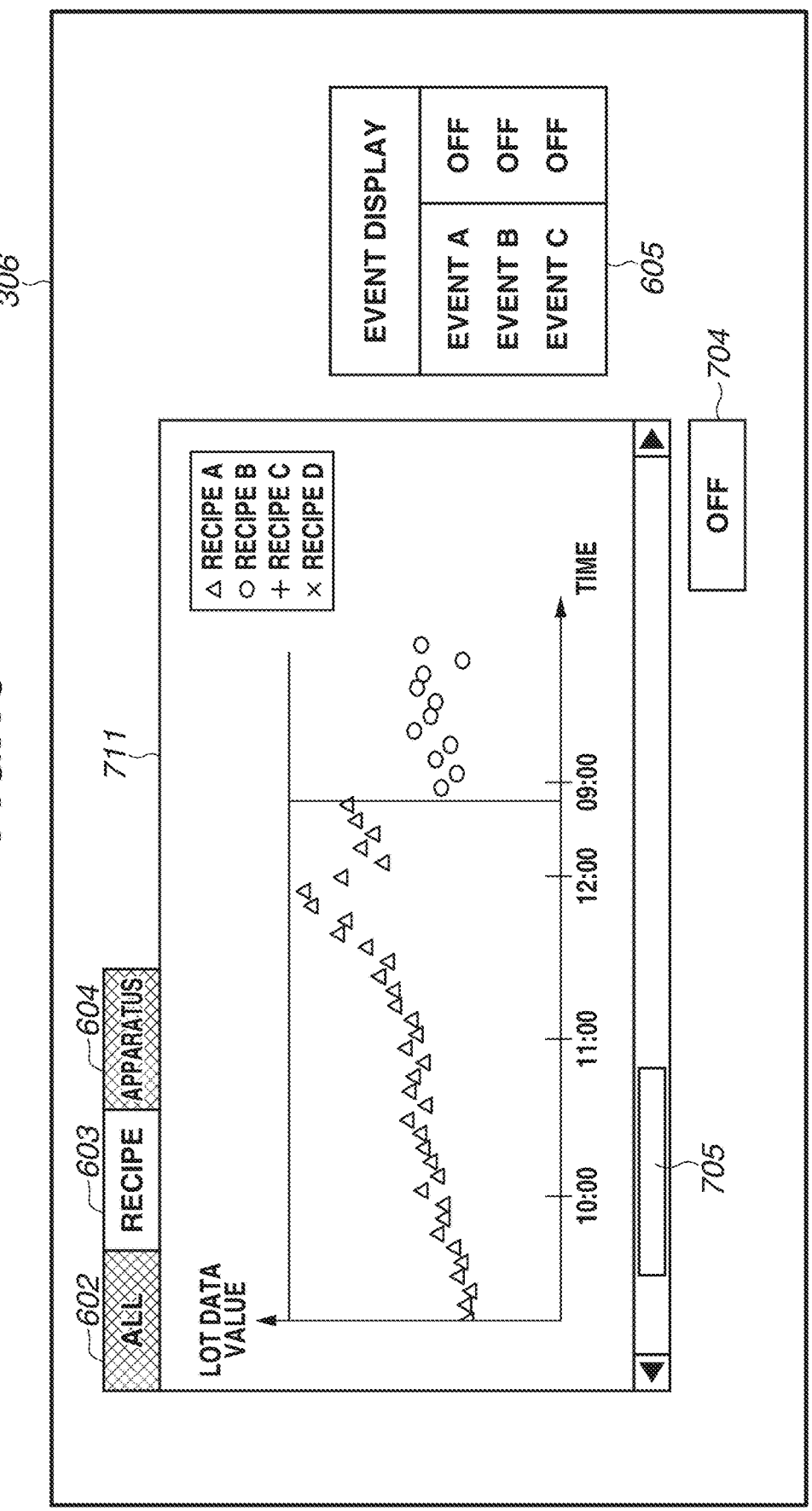
FIG. 10 is a diagram illustrating a graph displaying lot data of different recipes in different regions.

A setting button 704 is a button for setting whether to display the graphs of the respective recipes so that the graphs in the same display range are displayed. In a state where the setting button 704 is ON as illustrated in FIG. 8, the graphs of the respective recipes in the same time range are displayed as in the graph 701. On the contrary, FIG. 10 is a diagram illustrating a state where the setting button 704 is OFF. Although FIG. 10 is a diagram displaying the lot data of different recipes in different regions as in FIG. 8, the displayed time range is different for each recipe in a graph 711. Thus, in a case where there is a temporal change in a specific recipe, the display enables the user to view an overall trend of the recipe, and to easily determine the trend. Further, a recipe to be displayed and the time range of the recipe can be changed using the scroll bar 705.

Figure 11:
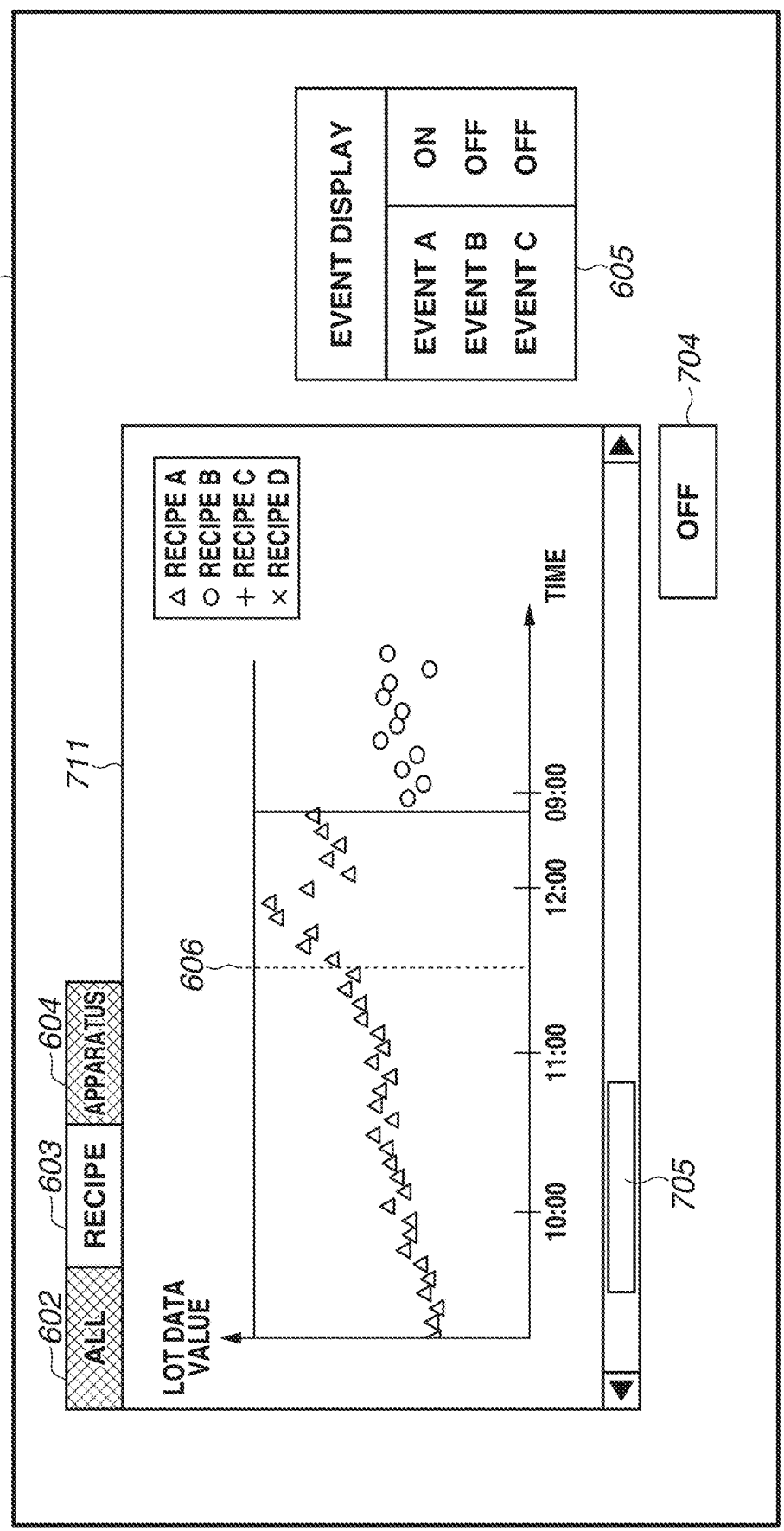
FIG. 11 is a diagram illustrating an event line superimposed on the graph displaying lot data of different recipes in different regions.
Figure 12:
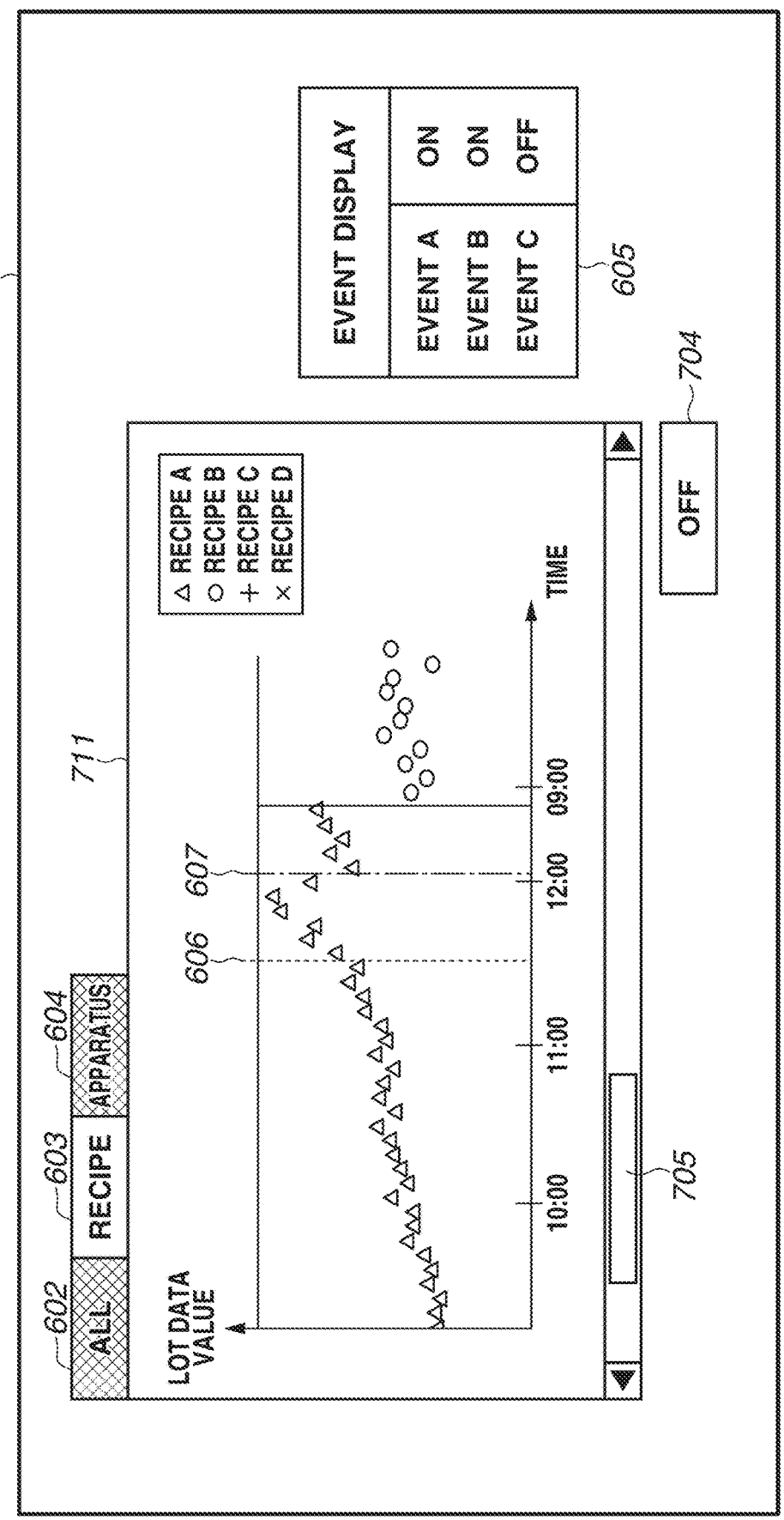
FIG. 12 is a diagram illustrating a plurality of event lines superimposed on the graph displaying lot data of different recipes in different regions.

FIG. 11 illustrates an example where the display state of the event A is switched from OFF to ON by selecting the event A on the event display window 605 in the display state in FIG. 10. The line 606 indicating the event A is superimposed on the graph 711 so that the user can determine that a change in the lot data of the recipe A starts around the timing of the occurrence of the event A. FIG. 12 illustrates an example where the display state of the event B is switched from OFF to ON in the display state in FIG. 11. A line 607 indicating the event B is superimposed on the graph 711 so that the user can determine that a further change in the lot data of the recipe A starts around the timing of the occurrence of the event B.

In step S507, in a case where the user chooses to end the screen display (YES in step S507), the screen display on the display device 306 ends. On the other hand, in a case where the user does not choose to end the screen display (NO in step S507), the processing returns to step S505. In step S505, the display control unit 404 continues to determine whether the graph display method is changed.

Thus, to analyze a cause of an abnormality, the user can selectively switch a graph display suitable for identifying the cause of the abnormality and an event display to be displayed in a superimposed manner on the graph display as described above. For example, in FIGS. 6 and 8, the graphs of the lot data of the plurality of recipes are displayed in the same region and displayed next to each other, respectively, so that the user can determine a trend in the lot data. Further, in FIGS. 7 and 9, the event lines are displayed in a superimposed manner on the graphs, so that the user can recognize that substrate processing results change after execution of an apparatus operation. For example, in FIG. 7, the user can determine that variation in the lot data of all of the recipes is reduced after the occurrence of the event A. For example, in a case where the event A is execution of maintenance, the user can determine a cause-and-effect relationship between the maintenance and the variation in the lot data, so that the user can determine a suitable timing for execution of the maintenance and can promptly execute a process to solve the abnormality.

Figure 13:
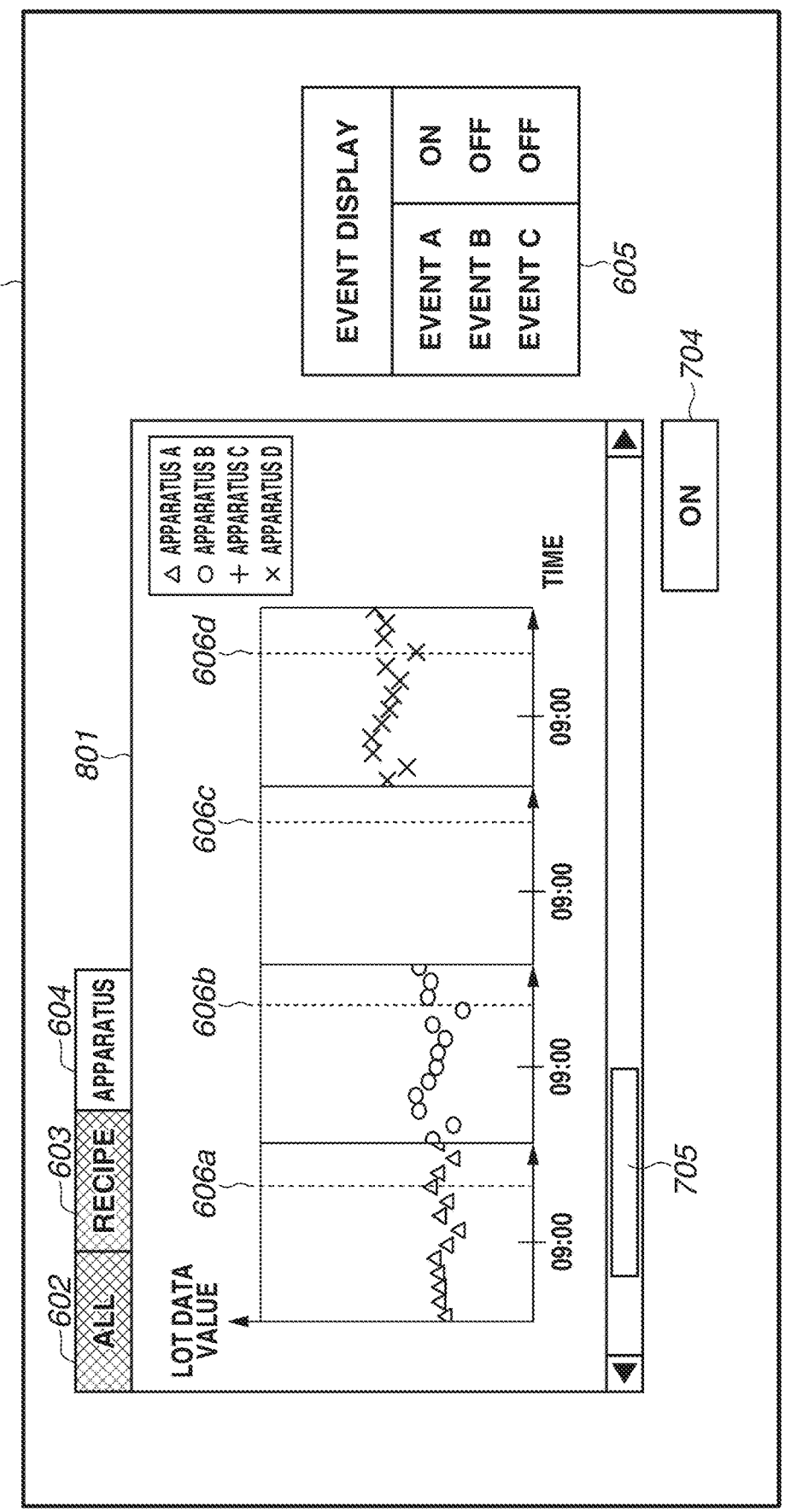
FIG. 13 is a diagram illustrating event lines superimposed on a graph displaying lot data of different apparatuses in different regions.

While the lot data is described as a statistical value of the processing data of a single lot, the lot data is not limited to that described above and can be a statistical value of the processing data of a plurality of lots to which the same recipe is applied. While the lot data of different recipes are displayed in different regions in FIGS. 8 and 9 according to the present exemplary embodiment, the display is not limited to those described above. FIG. 13 is a diagram illustrating a screen of the display device 306 in a case where the selection button 604 is selected. As illustrated in FIG. 13, a graph 801 displaying the lot data of different exposure apparatuses in different regions is displayed, and the lines 606a to 606d indicating an occurrence of an event are superimposed thereon.

While the analysis of a cause of an abnormality in the pattern forming apparatus 200 such as an exposure apparatus according to the present exemplary embodiment is described above as an example, an application to an analysis of a cause of an abnormality in a semiconductor manufacturing apparatus other than the pattern forming apparatus 200 is also possible. For example, the information processing apparatus according to the present exemplary embodiment is applicable to an analysis of a cause of an abnormality in the processing apparatus 201 or the inspection apparatus 202.

As described above, in the present exemplary embodiment, the event information can be displayed in a superimposed manner on the graph of the lot data on the display device 306, so that the time taken to solve an abnormality in a factor of a recipe is reduced.

<Article Manufacturing Method According to Exemplary Embodiment>

An article manufacturing method according to an exemplary embodiment of the present invention is suitable for use in manufacturing an article such as a micro-device, e.g., a semiconductor device, or an element having a fine structure. The article manufacturing method according to the present exemplary embodiment can include forming a pattern of an original on a substrate using the above-described article manufacturing system, and processing the substrate having the pattern formed thereon. The article manufacturing method can further include other known processes (oxidation, film formation, deposition, doping, planarization, etching, resist removing, dicing, bonding, and packaging). The article manufacturing method according to the present exemplary embodiment is more advantageous in at least one of performance, quality, productivity, and production cost of an article than conventional methods.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-016443, filed Feb. 4, 2021, which is hereby incorporated by reference herein in its entirety.

What is claimed is:

1. An information processing apparatus comprising:
a processor; a memory storing a program that, when executed by the processor, cause the processor to function as:
an acquisition unit configured to acquire information including a processing result of processing a substrate by a substrate processing apparatus configured to perform substrate processing at a first timing, event information on an event having occurred in the substrate processing apparatus at a second timing after the first timing, and a processing result of processing the substrate by the substrate processing apparatus at a third timing after the second timing;
a selection unit configured to select the event having occurred in the substrate processing apparatus; and
a display control unit configured to perform control so that a display device displays a chronological graph of a processing result of one region including the processing result at the first timing and the processing result at the third timing based on the information acquired by the acquisition unit,
wherein the display control unit performs control to display information indicating the second timing of the occurrence of the event selected by the selection unit on the chronological graph, and
wherein the event information includes at least one of information on resetting to initialize each unit of the substrate processing apparatus, information on a command given by a user to cause the substrate processing apparatus to perform a predetermined operation, information on replacement of a reticle on which a circuit pattern to be transferred to the substrate is drawn, and information on maintenance of the substrate processing apparatus.

2. The information processing apparatus according to claim 1, wherein the display control unit does not perform control to display information on the chronological graph, the information indicating a timing of the occurrence of the event not selected by the selection unit.

3. The information processing apparatus according to claim 1, wherein the display control unit performs control to display a line at the second timing on the chronological graph.

4. The information processing apparatus according to claim 3, wherein the display control unit changes at least one of color and shape of the line in displaying the line for an event of a type.

5. The information processing apparatus according to claim 1,
wherein the acquisition unit acquires processing results of processing by a plurality of substrate processing apparatuses, and
wherein the display control unit performs control to display each chronological graph of the processing results of the plurality of substrate processing apparatuses in regions different than the one region.

6. The information processing apparatus according to claim 1,
wherein the acquisition unit acquires processing results of processing by a plurality of substrate processing apparatuses, and
wherein the display control unit classifies the processing results of the plurality of substrate processing apparatuses by recipe and displays each chronological graph of the processing results of the recipes in regions different than the one region, the recipe being a processing condition set to be shared by the plurality of substrate processing apparatuses.

7. The information processing apparatus according to claim 6, wherein the display control unit performs control to display information at the second timing between the first timing and the third timing on each of the chronological graphs displayed in the regions by recipe.

8. The information processing apparatus according to claim 1, further comprising a calculation unit,
wherein the acquisition unit acquires a processing result for each substrate, and
wherein the calculation unit calculates a processing result for each lot including a plurality of substrates based on the processing result for each substrate acquired by the acquisition unit.

9. The information processing apparatus according to claim 8, wherein the calculation unit calculates the processing result for each lot including the plurality of substrates based on a single statistical value among a maximum value, a minimum value, a mean value, a median value, and a standard deviation value of processing results for each substrate.

10. The information processing apparatus according to claim 1, wherein the display control unit performs control to display the chronological graph of a processing result for each lot including a plurality of substrates.

11. An information processing method performed by a processor executing a program stored by a memory comprising:
acquiring information including a processing result of processing a substrate by a substrate processing apparatus configured to perform substrate processing at a first timing, event information on an event having occurred in the substrate processing apparatus at a second timing after the first timing, and a processing result of processing the substrate by the substrate processing apparatus at a third timing after the second timing;
selecting the event having occurred in the substrate processing apparatus; and performing control so that a display device displays a chronological graph of a processing result including the processing result at the first timing and the processing result at the third timing based on the acquired information, wherein information indicating the second timing of the occurrence of the selected event relating to the substrate processing apparatus is displayed on the chronological graph, and wherein the event information includes at least one of information on resetting to initialize each unit of the substrate processing apparatus, information on a command given by a user to cause the substrate processing apparatus to perform a predetermined operation, information on replacement of a reticle on which a circuit pattern to be transferred to the substrate is drawn, and information on maintenance of the substrate processing apparatus.

12. A non-transitory computer-readable storage medium storing a program for causing a computer to execute an information processing method performed by a processor executing a program stored by a memory comprising:

acquiring information including a processing result of processing a substrate by a substrate processing apparatus configured to perform substrate processing at a first timing, event information on an event having occurred in the substrate processing apparatus at a second timing after the first timing, and a processing result of processing the substrate by the substrate processing apparatus at a third timing after the second timing;

selecting the event having occurred in the substrate processing apparatus; and performing control so that a display device displays a chronological graph of a processing result including the processing result at the first timing and the processing result at the third timing based on the acquired information, wherein information indicating the second timing of the occurrence of the selected event relating to the substrate processing apparatus is displayed on the chronological graph, and wherein the event information includes at least one of information on resetting to initialize each unit of the substrate processing apparatus, information on a command given by a user to cause the substrate processing apparatus to perform a predetermined operation, information on replacement of a reticle on which a circuit pattern to be transferred to the substrate is drawn, and information on maintenance of the substrate processing apparatus.

13. An article manufacturing system comprising:

a pattern forming apparatus configured to form a pattern on a substrate; and an information processing apparatus configured to manage a plurality of apparatuses including the pattern forming apparatus, the information processing apparatus including:

a processor; a memory storing a program that, when executed by the processor, cause the processor to function as:

an acquisition unit configured to acquire information including a processing result of processing a substrate by a substrate processing apparatus configured to perform substrate processing at a first timing, event information on an event having occurred in the substrate processing apparatus at a second timing after the first timing, and a processing result of processing the substrate by the substrate processing apparatus at a third timing after the second timing;

a selection unit configured to select the event having occurred in the substrate processing apparatus; and a display control unit configured to perform control so that a display device displays a chronological graph of a processing result including the processing result at the first timing and the processing result at the third timing based on the information acquired by the acquisition unit, wherein the display control unit performs control to display information indicating the second timing of the occurrence of the event selected by the selection unit on the chronological graph, and wherein the event information includes at least one of information on resetting to initialize each unit of the substrate processing apparatus, information on a command given by a user to cause the substrate processing apparatus to perform a predetermined operation, information on replacement of a reticle on which a circuit pattern to be transferred to the substrate is drawn, and information on maintenance of the substrate processing apparatus.

14. An article manufacturing method comprising:

forming a pattern on a substrate using an article manufacturing system including a pattern forming apparatus configured to form a pattern on a substrate and an information processing apparatus configured to manage a plurality of apparatuses including the pattern forming apparatus; and performing at least one of oxidation, film formation, deposition, doping, planarization, etching, resist removing, dicing, bonding, and packaging processing on the substrate having the pattern formed thereon, wherein an article is manufactured from the processed substrate, the information processing apparatus including:

a processor; a memory storing a program that, when executed by the processor, cause the processor to function as:

an acquisition unit configured to acquire information including a processing result of processing a substrate by a substrate processing apparatus configured to perform substrate processing at a first timing, event information on an event having occurred in the substrate processing apparatus at a second timing after the first timing, and a processing result of processing the substrate by the substrate processing apparatus at a third timing after the second timing;

a selection unit configured to select the event having occurred in the substrate processing apparatus; and a display control unit configured to perform control so that a display device displays a chronological graph of a processing result including the processing result at the first timing and the processing result at the third timing based on the information acquired by the acquisition unit, wherein the display control unit performs control to display information indicating the second timing of the occurrence of the event selected by the selection unit on the chronological graph, and wherein the event information includes at least one of information on resetting to initialize each unit of the substrate processing apparatus, information on a command given by a user to cause the substrate processing apparatus to perform a predetermined operation, information on replacement of a reticle on which a circuit pattern to be transferred to the substrate is drawn, and information on maintenance of the substrate processing apparatus.

15. The method according to claim 11, further comprising performing control to display a line at the second timing on the chronological graph.

16. The method according to claim 11, further comprising:
acquiring processing results of processing by a plurality of substrate processing apparatuses, and
performing control to display each chronological graph of the processing results of the plurality of substrate processing apparatuses in regions different than the one region.

17. The method according to claim 11, further comprising:
acquiring processing results of processing by a plurality of substrate processing apparatuses, and
classifying the processing results of the plurality of substrate processing apparatuses by recipe and displaying each chronological graph of the processing results of the recipes in regions different than the one region, the recipe being a processing condition set to be shared by the plurality of substrate processing apparatuses.

18. The non-transitory computer-readable storage medium according to claim 13, further comprising performing control to display a line at the second timing between the first timing and the third timing on the chronological graph.

19. The non-transitory computer-readable storage medium according to claim 13, further comprising:
acquiring processing results of processing by a plurality of substrate processing apparatuses, and
performing control to display each chronological graph of the processing results of the plurality of substrate processing apparatuses in regions different than the one region.

20. The non-transitory computer-readable storage medium according to claim 13, further comprising:
acquiring processing results of processing by a plurality of substrate processing apparatuses, and
classifying the processing results of the plurality of substrate processing apparatuses by recipe and displaying each chronological graph of the processing results of the recipes in regions different from the one region, the recipe being a processing condition set to be shared by the plurality of substrate processing apparatuses.

* * * * *